(12) United States Patent
Touzard et al.

(10) Patent No.: US 8,279,003 B2
(45) Date of Patent: Oct. 2, 2012

(54) DIFFERENTIAL RF AMPLIFIER

(75) Inventors: Olivier Touzard, Grenoble (FR); Fabien Sordet, Grenoble (FR)

(73) Assignee: STMicroelectronics (Grenoble) SAS, Grenoble (FR)

( * ) Notice: Subject to any disclaimer, the term of this patent is extended or adjusted under 35 U.S.C. 154(b) by 121 days.

(21) Appl. No.: 12/988,094

(22) PCT Filed: Apr. 17, 2009

(86) PCT No.: PCT/EP2009/054594
§ 371 (c)(1),
(2), (4) Date: Dec. 1, 2010

(87) PCT Pub. No.: WO2009/127724
PCT Pub. Date: Oct. 22, 2009

(65) Prior Publication Data
US 2011/0109388 A1 May 12, 2011

(30) Foreign Application Priority Data
Apr. 18, 2008 (EP) .................................. 08305109

(51) Int. Cl.
*H03F 3/45* (2006.01)
(52) U.S. Cl. ........................................ 330/260; 330/252
(58) Field of Classification Search .................... 330/69, 330/252, 260, 261
See application file for complete search history.

(56) References Cited

U.S. PATENT DOCUMENTS

| 6,188,280 | B1* | 2/2001 | Filip ............................. 330/252 |
| 6,972,624 | B1 | 12/2005 | Stroet |
| 7,782,139 | B2* | 8/2010 | Gilbert .......................... 330/284 |
| 8,030,999 | B2* | 10/2011 | Chatterjee et al. ............ 330/253 |
| 2002/0093752 | A1 | 7/2002 | Pakriswamy et al. |
| 2004/0085667 | A1 | 5/2004 | Chung et al. |
| 2006/0057990 | A1 | 3/2006 | Behzad et al. |
| 2008/0036537 | A1 | 2/2008 | Syed |

FOREIGN PATENT DOCUMENTS
EP 0 590 811 A 4/1994

OTHER PUBLICATIONS
International Search Report dated May 28, 2009 from corresponding International Application No. PCT/EP2009/054594.

* cited by examiner

*Primary Examiner* — Henry Choe
(74) *Attorney, Agent, or Firm* — Wolf, Greenfield & Sacks, P.C.

(57) ABSTRACT

An RF amplifier including first and second branches coupled in parallel between first and second supply voltage terminals, and a differential pair including first and second transistors each having first and second main current terminals, the second main current terminal of the first transistor being coupled by a first capacitor to the first main current terminal of the second transistor, and the second main current terminal of the second transistor being coupled by a second capacitor to the first main current terminal of the first transistor, wherein the first branch includes a first resistor coupled between the first main current terminal of the first transistor and the second capacitor, and the second branch includes a second resistor; coupled between the first main current terminal of the second transistor and the first capacitor.

15 Claims, 3 Drawing Sheets

DIFFERENTIAL RF AMPLIFIER

CROSS REFERENCE TO RELATED APPLICATIONS

This application is a U.S. National Stage patent application based on PCT application number PCT/EP2009/054594, filed on Apr. 17, 2009, entitled "Differential Rf Amplifier", which application claims the priority benefit of European patent application number 08305109.4, filed on Apr. 18, 2008, entitled "Method For Forming A Priming Layer For Depositing A Metal On A Substrate," which applications are hereby incorporated by reference to the maximum extent allowable by law.

BACKGROUND OF THE INVENTION

1. Field of the Invention

The present invention relates to an RF amplifier, and in particular to a differential RF amplifier.

2. Discussion of the Related Art

Differential RF amplifiers are devices designed to amplify, buffer at unitary gain or attenuate a differential RF input signal. Due to the nature of RF signals, there are various design considerations. For example, generally such circuits are designed with the aim that a common mode voltage between the differential inputs is attenuated, that linearity is high without high current consumption, that little noise is added to the RF signal and that the area of the device is low to keep the cost of the device reasonable.

In practice, known RF amplifiers generally fail to provide good common mode rejection at the same time as acceptable linearity between the input and the output. There is thus a need in the art for a new RF amplifier circuit that is better adapted to meet these design aims.

SUMMARY OF THE INVENTION

It is an aim of embodiments of the present invention to at least partially address one or more of the needs in the prior art.

According to one aspect of the present invention there is provided an RF amplifier comprising first and second branches coupled in parallel between a first supply voltage terminal and a second supply voltage terminal, said branches defining a differential pair arranged to be controlled by a differential input signal comprised of first and second input signals, the differential pair comprising a first transistor in said first branch and a second transistor in said second branch, wherein said first and second transistors each comprise first and second main current terminals, said second main current terminal of said first transistor being coupled by a first capacitor to the first main current terminal of said second transistor, and said second main current terminal of said second transistor being coupled by a second capacitor to the first main current terminal of said first transistor, said first or second main current terminals of the first and second transistors being coupled to differential output nodes of said RF amplifier, wherein said first branch comprises a first resistor coupled between said first main current terminal of the first transistor and the second capacitor, and said second branch comprises a second resistor coupled between said first main current terminal of said second transistor and the first capacitor.

According to one embodiment of the present invention, the first and second branches comprise first and second current sources respectively, coupled respectively between the first and second transistors and one of the first and second supply voltage terminals.

According to another embodiment of the present invention, the first and second current sources are variable current sources controlled by a feedback signal from the differential pair.

According to another embodiment of the present invention, the first and second transistors are NPN bipolar transistors.

According to one embodiment of the present invention, the first and second resistors each have a resistance of 30 ohms or more, for example, between 30 and 100 ohms.

According to another embodiment of the present invention, the first and second branches each comprise a third resistor coupled to said first supply voltage terminal.

According to another embodiment of the present invention, the first resistor is connected between the first main current terminal of the first transistor and a first one of the differential output nodes, and the second resistor is connected between the first main current terminal of the second transistor and a second one of the differential output nodes.

According to another embodiment of the present invention, the first resistor is connected between the first main current terminal of the first transistor and the first supply voltage terminal, and the second resistor is connected between the first main current terminal of the second transistor and the first supply voltage terminal, the first nodes of the first and second transistors forming the differential output nodes of the RF amplifier.

According to another embodiment of the present invention, the resistance of said first and second resistors is less than or equal to the resistance of said third resistors.

According to another embodiment of the present invention, the resistance of the first and second resistors is equal to $a_2 R$, the resistance of the third resistors is equal to $a_1 R$, the current gain of the first and second transistors is $\beta$, and the resistances of the first, second and third resistors are chosen such that $a_1$ is between 20 and 100 percent of $\beta a_2$.

According to a further aspect of the present invention, there is provided a mobile device or satellite receiver comprising the above RF amplifier.

According to a further aspect of the present invention, there is provided an RF device comprising an input for receiving a differential RF signal; and the above RF amplifier.

According to a further aspect of the present invention, there is provided a system comprising receiving circuitry for receiving a differential RF input signal comprised of first and second RF input signals; an input node coupled to said receiving circuitry; and the above RF amplifier.

BRIEF DESCRIPTION OF THE DRAWINGS

The foregoing and other purposes, features, aspects and advantages of the invention will become apparent from the following detailed description, given by way of illustration and not limitation with reference to the accompanying drawings, in which.

DETAILED DESCRIPTION

Figure 1:
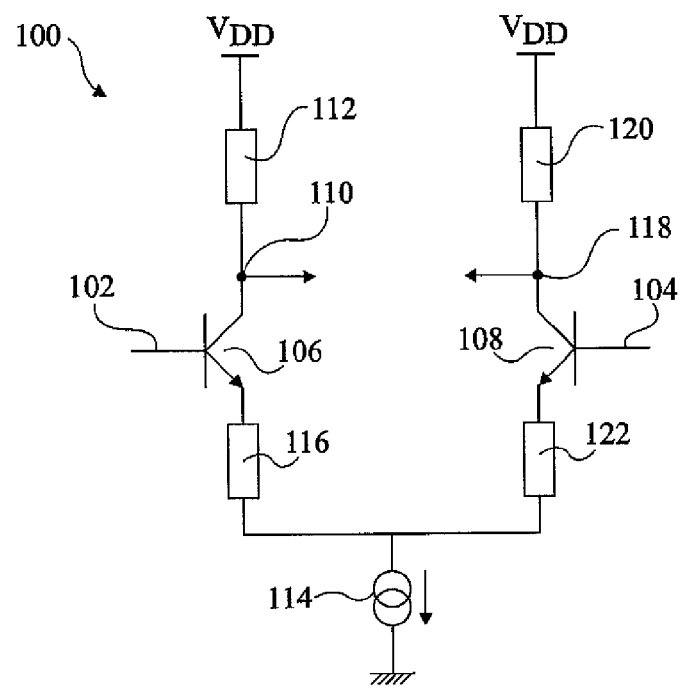
FIG. 1 is a circuit diagram illustrating an RF amplifier circuit.

FIG. 1 illustrates an RF amplifier circuit 100. RF amplifier 100 comprises differential input nodes 102, 104. Input 102 is connected to the base node of a bipolar transistor 106, while input 104 is connected to the base node of a bipolar transistor 108. The collector of bipolar transistor 106 is connected to a node 110, which is in turn connected to the supply voltage $V_{DD}$ via a resistor 112. The emitter of bipolar transistor 106 is connected to a current source 114 via a resistor 116. The collector of bipolar transistor 108 is coupled to a node 118, which is in turn coupled to the supply voltage $V_{DD}$ via a resistor 120. The emitter of bipolar transistor 108 is coupled to the current source 114 via a resistor 122.

In the circuit of FIG. 1, linearity is generally poor when resistors 116 and 122 have relatively low resistance values, and while it can be improved to some extent by increasing the values of resistors 116 and 122, this results in relatively high noise at the output of the RF amplifier, which is undesirable. On the other hand, decreasing noise and increasing linearity could to some extent be achieved by increasing the current, but this is undesirable. Furthermore, it is difficult to match the output impedance in this circuit, for example, at 50 Ohms, while maintaining reasonable linearity, noise and current consumption of the circuit.

Figure 2:
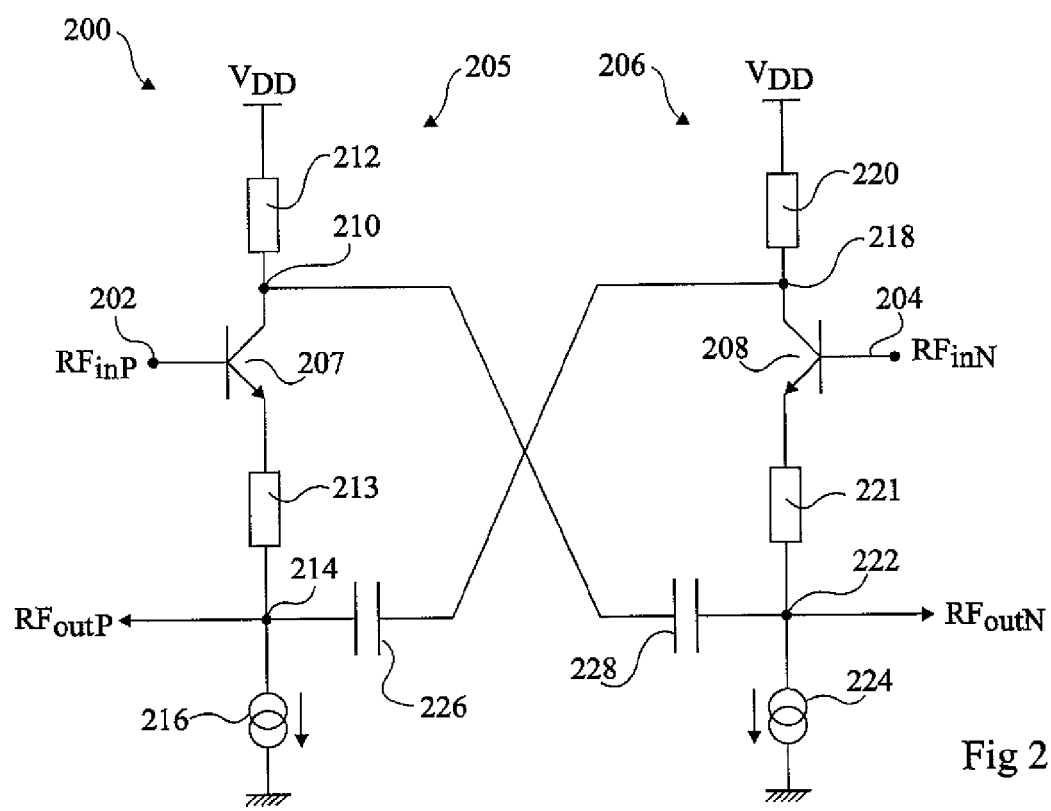
FIG. 2 is a circuit diagram illustrating an RF amplifier according to an embodiment of the present invention.

FIG. 2 is a circuit diagram illustrating a differential RF amplifier 200, comprising input terminals 202 and 204, which receive input signals $RF_{inP}$ and $RF_{inN}$ of an input differential RF signal received, for example, via an AC coupled antenna or other receiving circuitry. Amplifier 200 comprises branches 205 and 206 that define a differential pair comprising a bipolar NPN transistor 207 in branch 205 and a bipolar NPN transistor 208 in branch 206, transistors 207 and 208 having their respective base terminals coupled to input nodes 202 and 204 respectively.

Branch 205 further comprises a node 210 coupled to the collector terminal of transistor 207, a resistor 212 coupled between node 210 and a supply voltage $V_{DD}$, a resistor 213 coupled between the emitter terminal of transistor 207 and a node 214, node 214 being coupled to a further supply voltage, in this example a ground voltage, via current source 216.

Branch 206 further comprises a node 218 coupled to the collector terminal of transistor 208, a resistor 220 coupled between node 218 and a supply voltage $V_{DD}$, a resistor 221 coupled between the emitter terminal of transistor 208 and a node 222, node 222 being coupled to a further supply voltage, in this example a ground voltage, via a current source 224.

Nodes 214 and 222 coupled to resistors 213 and 221 respectively provide differential output nodes of the circuit, outputting RF signals $RF_{outP}$ and $RF_{outN}$ respectively. Furthermore, the emitter and collector terminals of transistors 207 and 208 are cross-coupled via capacitors 226 and 228. In particular, node 214 is coupled to node 218 via a capacitor 226, while node 222 is coupled to node 210 via a capacitor 228.

Resistors 213 and 221, for example, each have a resistance of 30 ohms or more, for example, in the range 30 to 100 ohms. Resistors 212 and 220, for example, each have a resistance in the range of 30 to 150 ohms. In one example, resistors 213 and 221 each have resistance values of 40 ohms, while resistors 212 and 220 each have a resistance of 120 ohms.

In operation, the RF amplifier circuit 200 of FIG. 2 provides an amplifier having a gain of less that 1, in other words an attenuator. High common mode rejection of the input RF signals is provided by the cross-coupling of the terminals of the differential pair and the resistors 213 and 221. In particular, the loop created by the cross-coupling capacitors 226 and 228 includes the resistors 213 and 221 of the branches 205 and 206. This results in a high common mode rejection, higher that the normal attenuation associated with the attenuation configuration of the amplifier. Common mode rejection results from the fact that if there is any common mode in the two differential input signals $RF_{inP}$ and $RF_{inN}$, this will induce the same current that circulates through both transistors 207 and 208 and resistors 213 and 221 in the same direction, these currents balancing, thereby resulting in no residue current to a load coupled at the output nodes. On the other hand, the differential mode voltage induces opposite currents in each transistor 207, 208, which are both provided to supply a load at the differential output nodes. This push-pull effect means that less AC current is needed in each branch of the circuit to drive a load, resulting in good linearity.

Capacitors 226 and 228 prevent DC coupling, and have values, for example, chosen to be low impedance at the operating frequency of the circuit, which is, for example, in the range 0.5 or 1 GHz to 6 GHz. Capacitance values in the range 1 to 100 pF, and, for example, approximately 10 pF, could be used.

Assuming resistors 212, 220 each have resistance values of $a_1 R$, resistors 213, 221 each have resistance values of $dR$, where $a_1$, d and R are constants, the differential output impedance can be expressed as:

$$Z_{outdiff} = 2R(a_1 d)/((2a_1)+d)$$

As an example, a combined output load of approximately 75 ohms, the values R=40 and $a_1$=3 and d=1 could, for example, be used. The gain of RF amplifier 300 can be determined as follows. It is assumed that each transistor 207, 208 is modelled to have a base-emitter current $I_{be}$ equal to $gmV_{be}/\beta$ and a collector-emitter current $gmV_{be}$, where gm is a measure of the conductance of each transistor at a given frequency, $\beta$ is a measure of the current gain at a given frequency, and $V_{be}$ is the voltage between the base and the emitter terminal of each transistor, assuming no parasitic capacitances. Furthermore, as above, the resistors 212, 220 have resistance values of $a_1 R$, resistors 213, 221 have resistance values of $dR$, and the resistance of the output load is $o_1 R$, where $a_1$, d, $o_1$ and R are constants. The common mode gain can then be expressed as:

$$CommonModeGain = \frac{1/\beta}{\frac{(a_1+o_1)}{a_1 o_1}\left(\frac{1}{gmR}+d\frac{\beta+1}{\beta}\right)+\frac{1}{\beta}}$$

while the differential mode gain can be expressed as:

$$DifferentialModeGain = \frac{2+1/\beta}{\frac{(a_1+o_1)}{a_1 o_1}\left(\frac{1}{gmR}+d\frac{\beta+1}{\beta}\right)+2+\frac{1}{\beta}}$$

As an example, assuming, for a given frequency, $\beta$ is 10 and gm is 100 mS, while R=50 Ohms and d, $o_1$ and $a_1$ all equal 1, the common mode gain can be determined as being equal to −28.6 dB, and the differential mode gain can be determined as being equal to −7 dB. In comparison, in a same circuit without resistors 213 and 221 the common mode gain can be determined as approximately −15 dB, and differential gain as approximately −1.5 dB.

Figure 3:
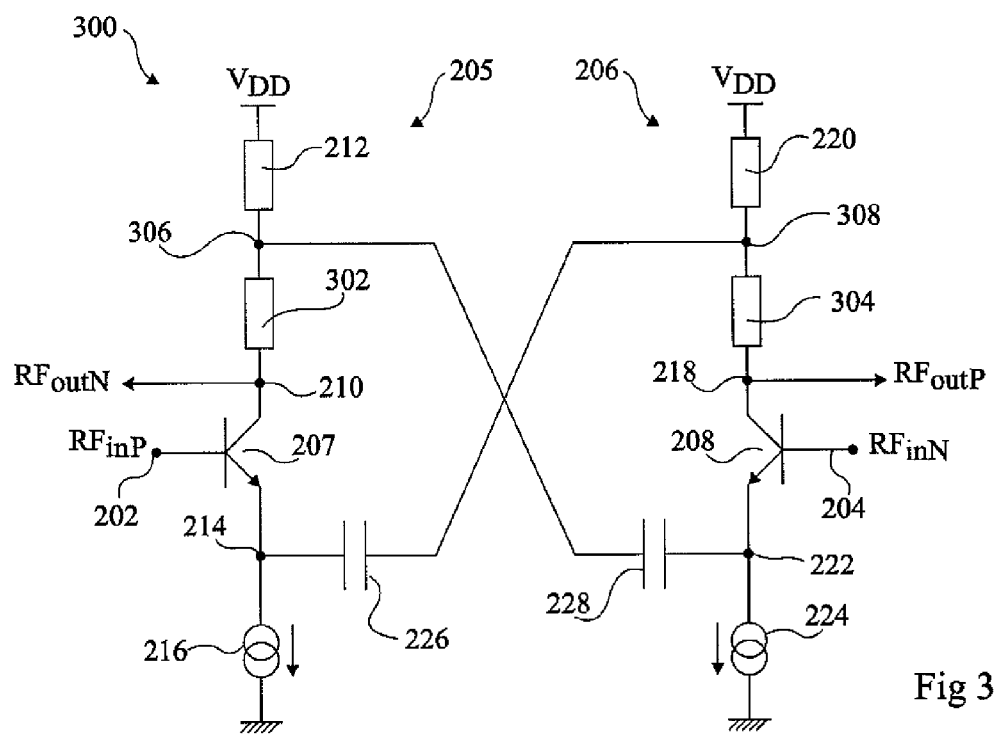
FIGS. 3 and 4 are circuit diagrams illustrating RF amplifiers according to further embodiments of the present invention.

FIG. 3 illustrates an RF amplifier 300, which is similar to circuit 200 of FIG. 2, and like parts have been labelled with the same reference numerals and will not be described again in detail. However, in the embodiment of FIG. 3, resistors 213 and 221 are removed, and nodes 210 and 218 are coupled to resistors 212 and 220 via resistors 302 and 304 respectively, and rather than being coupled to nodes 210 and 218, capacitor 228 is coupled to a node 306 between resistors 212 and 302, while capacitor 226 is coupled to a node 308 between resistors 220 and 304. Furthermore, in the embodiment of FIG. 3, node 210 provides the output RFoutN, while node 218 provides the output RFoutP. In this configuration, amplifier circuit 300 can have a gain greater that 1, or more generally a positive or negative gain. It has been found that this circuit has particularly good performance with a negative gain close to 0 dB.

In operation, the circuit operates in a similar fashion to that of FIG. 2. Assuming resistors 302 and 304 have resistances of $a_2R$, where $a_2$ and R are constants, and assuming ideal transistors with no parasitic capacitance effects, the differential output impedance can be determined as being equal to $a_2R$.

As with the circuit of FIG. 2, common mode rejection of the input RF signals is provided by the combination of the cross-coupling of the terminals of the differential pair and a pair or resistors that are included in the loop, in this case resistors 302 and 304. Furthermore, due to a push-pull effect linearity between the input and output nodes is high.

Resistors 212 and 220 of FIG. 3, for example, have resistances in the range 30 to 300 ohms. Resistors 302 and 304, for example, have resistances in the range 20 to 100 ohms.

Using the same references as above, and wherein the resistance of resistors 302 and 304 is equal to $a_2R$, and the output load has a resistance of $o_2R$, the common mode gain can be expressed as:

$$CommonModeGain = \frac{\frac{1}{\beta} - \frac{a_2}{a1}}{\frac{(a_1+a_2+o_2)}{a_1 o_2}\left(\frac{1}{gmR}\right) + \frac{\beta+1}{\beta} \cdot \frac{a_2+o_2}{o_2} - 1}$$

while the differential mode gain can be expressed as:

$$DifferetialModeGain = \frac{2 + \frac{1}{\beta} + \frac{a_2}{a1}}{\frac{(a_1+a_2+o_2)}{a_1 o_2}\left(\frac{1}{gmR}\right) + \frac{\beta+1}{\beta} \cdot \frac{a_2+o_2}{o_2} + 1}$$

By way of example, assuming, for a given frequency, β is 10 and gm is 100 mS, while R=50 Ohms and $O_2$=1, $a_1$=0.5 and $a_2$=2, the common mode gain can be determined as being equal to +0.5 dB, and the differential mode gain can be determined as being equal to +0.6 dB. On the other hand, assuming the same values except that $a_2$=1 and $a_1$=4, the common mode gain can be determined as being −20 dB, while the differential mode gain can be determined as being equal to −3.5 dB. Thus it will be apparent to those skilled in the art that there is a trade off between the differential mode and common mode gains.

For example, in the circuit of FIG. 3, high common mode rejection can be achieved by choosing a resistance of resistors 212 and 220 of between 30 and 300 ohms, and a resistance of resistors 302 and 304 of less than the resistance of resistors 212 and 220. Particularly high common mode rejection is, for example, achieved by choosing $a_1$ and $a_2$ such that $a_1$ is approximately equal to $\beta a_2$. For example, $a_1$ is between 20 and 100 percent of $\beta a_2$. Assuming a value of β of around 10, resistors 212 and 220 thus, for example, have resistance values of between 2 and 10 times those of resistors 302 and 304. Thus, if resistors 302 and 304 have resistances of 50 ohms, resistors 212 and 220 are, for example, chosen to have resistance values of between 100 and 500 ohms. Alternatively, $a_1$ could be chosen to be between 40 and 100 percent of $\beta a_2$, such that, given a β, resistors 212 and 220 are between 4 and 10 times those of resistors 302 and 304.

Figure 4:
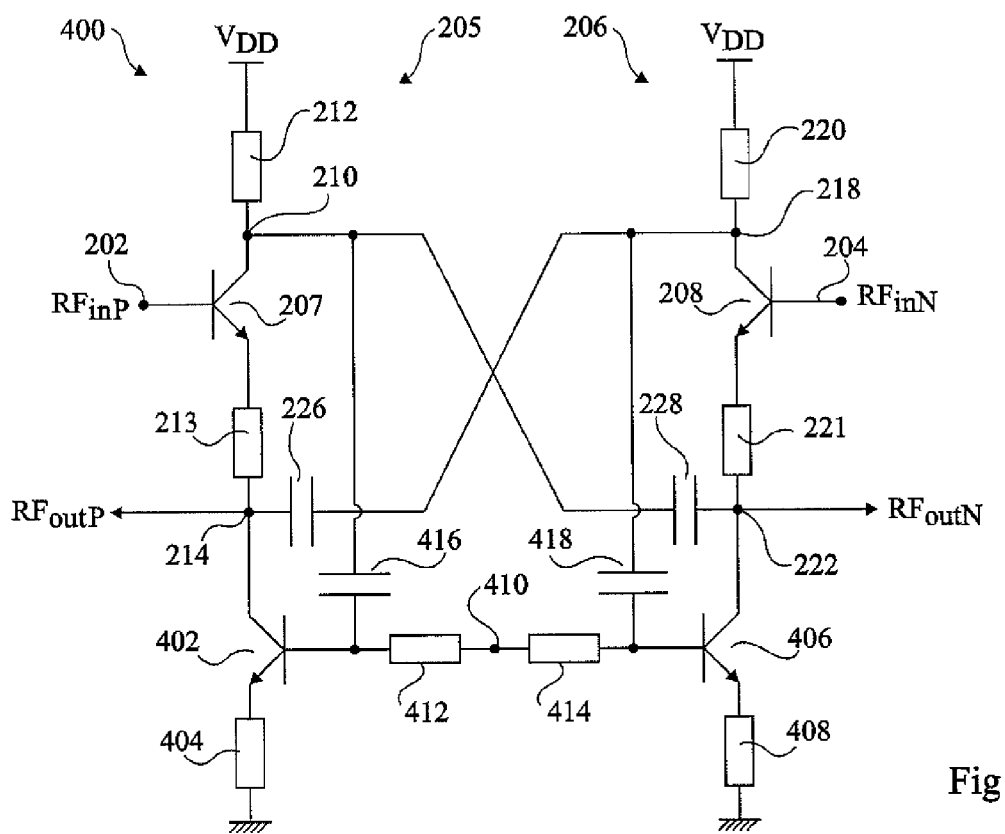

FIG. 4 illustrates an RF amplifier circuit 400, which comprises the circuit 200 of FIG. 2, except that in FIG. 4, current sources 216 and 224 have been replaced by variable current sources. In particular, current source 216 has been replaced by a bipolar NPN transistor 402 coupled by its main current terminals between node 214 and a resistor 404, which is in turn coupled to a ground voltage. Similarly, current source 224 is replaced by a bipolar NPN transistor 406 coupled by its main current terminals between node 222 and a resistor 408, which is in turn coupled to a ground voltage. The base terminals of transistors 402 and 406 are coupled to a common node 410 via respective resistors 412, 414. Furthermore, the base terminal of transistor 402 is coupled to node 210 by a capacitor 416, while the base terminal of transistor 406 is coupled to node 218 by a capacitor 418. Capacitors 416 and 418, for example, have approximately the same capacitances as capacitors 226 and 228.

According to some embodiments, the emitters of transistors 402 and 406 could be connected together, allowing a higher gain in the linearizing feed-back loop, and thus improved linearity. Furthermore, some variations would be possible for generating a voltage at node 410 for regulating the DC current in each branch.

An advantage of the structure of FIG. 4 is that the variable current sources provided by transistors 402 and 406 allow these currents to be varied based on feedback from the differential pair 207, 208, and this enables even better linearity of the circuit.

It will be apparent to those skilled in the art that the circuitry 402 to 418 for providing the variable current source could be added in alternative embodiments to the amplifier configuration 300 of FIG. 3 if the variable current source feedbacks are cross-coupled, as the input and output have opposite signs.

Figure 5:
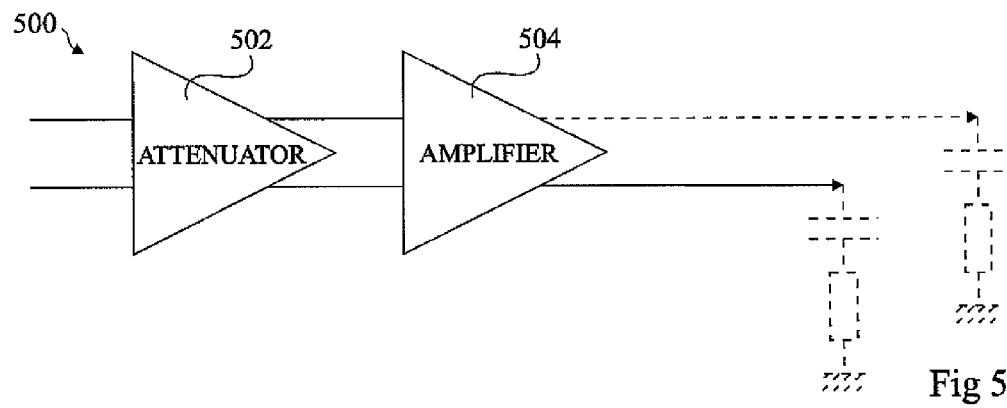
FIG. 5 illustrates RF circuitry comprising an RF amplifier according to embodiments of the present invention.

FIG. 5 illustrates RF circuitry 500 comprising an RF amplifier 502 in the form of an attenuator, for example, the attenuator of FIG. 2 or FIG. 4. Amplifier 502 comprises a pair of differential inputs, and a pair of differential outputs coupled to an amplifier 504. RF Amplifier 504 could be a differential amplifier, such as amplifier 300 of FIG. 3, or could have a single-ended output. As illustrated, the single-ended output or differential output of amplifier 504 are AC coupled by a capacitor to a load which can be represented as, on each line, a resistor coupled to a ground voltage. Due to common mode rejection, each single ended output can have very low even order harmonics, approaching the levels of differential outputs.

The attenuator and amplifier combination of FIG. 5 can be expanded with more attenuators coupled in parallel with attenuator 502 to provide an attenuator tree taking the differential signal at the input, which could, for example, be the output of a voltage controlled oscillator or the like, and providing it to various RF circuitry, including, for example, a prescalar, various mixers, and/or a load.

Figure 6:
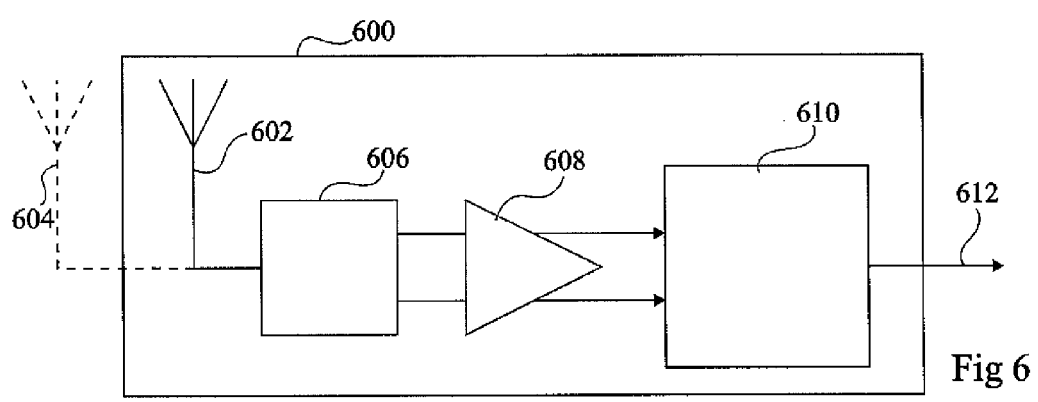
FIG. 6 illustrates an RF device comprising an RF amplifier according to embodiments of the present invention.

FIG. 6 illustrates an electronic device 600 comprising an RF differential amplifier as described in one of the embodiments herein. Device 600 comprises an aerial 602, integrated inside the device, or an external aerial as illustrated by dashed lines 604. The antenna 602/604 is coupled to a block 606, for example a balun, which separates the single-ended input from the aerial into a pair of differential signals. The differential outputs from block 606 are coupled to an RF amplifier 608, which is, for example, one of the differential amplifier configurations described herein. The differential outputs from amplifier 608 are coupled to RF circuitry 610, which processes the signal and, for example, provides a single-ended or differential output on one or two output lines 612.

Device 600 is for example a mobile telephone, satellite receiver, games console, navigation aid, laptop computer, TV tuner or other device arranged to receive a differential RF signal.

An advantage of the embodiments of the RF differential amplifier described herein is that by cross-coupling with a capacitor the terminals of a differential pair of the amplifier, with resistors coupled to the terminals of the differential pair, high common mode rejection at the same time as high linearity between the input and the output can be achieved. In particular, in embodiments described herein, for example when driving and matching an output impedance of 75 Ohms differential with −5 dB gain, IIP3 linearity with −10 dBm at 2.15 GHz can be as high as between 25 and 35 dBm, while common mode rejection at 6.2 GHz can be between −15 and −25 dB.

A further advantage of some embodiments described herein is that NPN transistors can be used as both the transistors of the cross-coupled differential pair, and such devices are generally faster than PNP transistors. In particular, in the described embodiments a push-pull structure is used, wherein the push and pull are achieved by two matched NPN transistors, rather than an NPN and a PNP.

It should be noted that the resistors described herein are passive devices, rather than active devices.

While a number of particular embodiments have been described, it will be apparent to those skilled in the art that various modifications can be applied.

For example, while in the described embodiments the transistors are described as being bipolar transistors such as bipolar junction transistors (BJT), in alternative embodiments other types of transistors could be used, and in particular one or more of the transistors could be replaced by MOS (metal oxide semiconductor) transistors. It will also be apparent to those skilled in the art that while all of the transistors illustrated in the various embodiments are NPN bipolar transistors, it would be possible to replace one or more of these by PNP bipolar transistors.

Furthermore, it will be apparent that it would be possible to invert the circuits of FIG. 2, 3 or 4, such that $V_{DD}$ and ground are inversed. The ground voltage level need not be at zero volts, while the supply voltage level could be positive or negative.

It will be apparent to those skilled in the art that while output node have been shown in the various figures on one side of the differential pair, in alternative embodiments they could equally be provided at nodes on the other side of the differential pair. For example, in FIGS. 2 and 4, nodes 210, 218 could provide the differential output RF signals, while in FIG. 3 nodes 214 and 222 could provide the differential output signal.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An RF amplifier comprising:
first and second branches coupled in parallel between a first supply voltage terminal and a second supply voltage terminal, said branches defining a differential pair arranged to be controlled by a differential input signal comprised of first and second input signals, the differential pair comprising a first transistor in said first branch and a second transistor in said second branch, wherein said first and second transistors each comprise first and second main current terminals, said second main current terminal of said first transistor being coupled by a first capacitor to the first main current terminal of said second transistor, and said second main current terminal of said second transistor being coupled by a second capacitor to the first main current terminal of said first transistor, said first or second main current terminals of the first and second transistors being coupled to differential output nodes of said RF amplifier, wherein said first branch comprises a first resistor coupled between said first main current terminal of the first transistor and the second capacitor, and said second branch comprises a second resistor coupled between said first main current terminal of said second transistor and the first capacitor.

2. The RF amplifier of claim 1, wherein said first and second branches comprise first and second current sources respectively, coupled respectively between said first and second transistors and one of said first and second supply voltage terminals.

3. The RF amplifier of claim 2, wherein said first and second current sources are variable current sources controlled by a feedback signal from said differential pair.

4. The RF amplifier of claim 1, wherein said first and second transistors are NPN bipolar transistors.

5. The RF amplifier of claim 1, wherein the first and second resistors each have a resistance of 30 ohms or more.

6. The RF amplifier of claim 5, wherein the first and second resistors each have a resistance of between 30 and 100 ohms.

7. The RF amplifier of claim 1, wherein the first and second branches each comprise a third resistor (212, 222) coupled to said first supply voltage terminal.

8. The RF amplifier of claim 7, wherein the first resistor (213) is connected between the first main current terminal of the first transistor and a first one of the differential output nodes, and the second resistor is connected between the first main current terminal of the second transistor and a second one of the differential output nodes.

9. The RF amplifier of claim 8, wherein the first resistor (302) is connected between the first main current terminal of the first transistor and the first supply voltage terminal, and the second resistor (304) is connected between the first main current terminal of the second transistor and the first supply voltage terminal, the first nodes of the first and second transistors forming the differential output nodes of the RF amplifier.

10. The RF amplifier of claim 9, wherein the resistance of said first and second resistors is less than or equal to the resistance of said third resistors.

11. The RF amplifier of claim 9, wherein the resistance of the first and second resistors equal to $a_2 R$, the resistance of the third resistors is equal to $a_1 R$, the current gain of the first and second transistors is $\beta$, and the resistances of the first, second and third resistors are chosen such that $a_1$ is between 20 and 100 percent of $\beta a_2$.

12. A mobile device comprising the RF amplifier of claim 1.

13. A satellite receiver comprising the RF amplifier of any claim 1.

14. An RF device comprising:
an input for receiving a differential RF signal;
first and second branches coupled in parallel between a first supply voltage terminal and a second supply voltage terminal, said branches defining a differential pair arranged to be controlled by a differential input signal comprised of first and second input signals, the differential pair comprising a first transistor in said first branch and a second transistor in said second branch, wherein said first and second transistors each comprise first and second main current terminals, said second main current terminal of said first transistor being coupled by a first capacitor to the first main current terminal of said second transistor, and said second main current terminal of said second transistor being coupled by a second capacitor to the first main current terminal of said first transistor, said first or second main current terminals of the first and second transistors being coupled to differential output nodes of said RF amplifier, wherein said first branch comprises a first resistor coupled between said first main current terminal of the first transistor and the second capacitor, and said second branch comprises a second resistor coupled between said first main current terminal of said second transistor and the first capacitor.

15. A system comprising:
receiving circuitry for receiving a differential RF input signal comprised of first and second RF input signals;
an input node coupled to said receiving circuitry; and
an RF amplifier comprising first and second branches coupled in parallel between a first supply voltage terminal and a second supply voltage terminal, said branches defining a differential pair arranged to be controlled by a differential input signal comprised of first and second input signals, the differential pair comprising a first transistor in said first branch and a second transistor in said second branch, wherein said first and second transistors each comprise first and second main current terminals, said second main current terminal of said first transistor being coupled by a first capacitor to the first main current terminal of said second transistor, and said second main current terminal of said second transistor being coupled by a second capacitor to the first main current terminal of said first transistor, said first or second main current terminals of the first and second transistors being coupled to differential output nodes of said RF amplifier, wherein said first branch comprises a first resistor coupled between said first main current terminal of the first transistor and the second capacitor, and said second branch comprises a second resistor coupled between said first main current terminal of said second transistor and the first capacitor.

* * * * *

UNITED STATES PATENT AND TRADEMARK OFFICE
CERTIFICATE OF CORRECTION

PATENT NO. : 8,279,003 B2
APPLICATION NO. : 12/988094
DATED : October 2, 2012
INVENTOR(S) : Olivier Touzard et al.

It is certified that error appears in the above-identified patent and that said Letters Patent is hereby corrected as shown below:

In the Specification:

At column 1, lines 12 and 13 should read as follows:

2008, entitled "Differential RF Amplifier," which applications are

Signed and Sealed this
Seventeenth Day of December, 2013

Margaret A. Focarino
*Commissioner for Patents of the United States Patent and Trademark Office*